(12) United States Patent
Niebojewski

(10) Patent No.: US 11,387,100 B2
(45) Date of Patent: Jul. 12, 2022

(54) METHOD FOR MANUFACTURING A MIXED SUBSTRATE

(71) Applicant: COMMISSARIAT A L'ENERGIE ATOMIQUE ET AUX ENERGIES ALTERNATIVES, Paris (FR)

(72) Inventor: Heimanu Niebojewski, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 28 days.

(21) Appl. No.: 17/016,634

(22) Filed: Sep. 10, 2020

(65) Prior Publication Data
US 2021/0090884 A1   Mar. 25, 2021

(30) Foreign Application Priority Data

Sep. 11, 2019 (FR) ...................................... 19 10002

(51) Int. Cl.
*H01L 21/02* (2006.01)
*H01L 21/306* (2006.01)
*H01L 21/762* (2006.01)

(52) U.S. Cl.
CPC .. *H01L 21/02381* (2013.01); *H01L 21/02636* (2013.01); *H01L 21/30604* (2013.01); *H01L 21/762* (2013.01)

(58) Field of Classification Search
None
See application file for complete search history.

(56) References Cited

U.S. PATENT DOCUMENTS

| | | |
|---|---|---|
| 2014/0264636 A1 | 9/2014 | Tsai et al. |
| 2016/0204128 A1 | 7/2016 | Baars et al. |
| 2018/0069079 A1 | 3/2018 | Fanelli et al. |
| 2018/0096884 A1 | 4/2018 | Shank et al. |
| 2021/0090884 A1* | 3/2021 | Niebojewski ..... H01L 21/02381 |

FOREIGN PATENT DOCUMENTS

WO   WO 2019/094052 A1   5/2019

OTHER PUBLICATIONS

French Preliminary Search Report dated May 14, 2020 in French Application 19 10002 filed on Sep. 11, 2019 (with English Translation of Categories of Cited Documents), 2 pages.

* cited by examiner

*Primary Examiner* — Jack S Chen
(74) *Attorney, Agent, or Firm* — Oblon, McClelland, Maier & Neustadt, L.L.P.

(57) ABSTRACT

A method for manufacturing a mixed substrate having, on a main face of a support substrate, a first region and a second region, includes a) providing a starting substrate which comprises an intermediate layer, consisting of the second material, and the support substrate; b) forming a mask which comprises an aperture delimiting the first region; c) forming a cavity; and d) forming the first region by epitaxially growing the first material in a single crystal form in the cavity The method includes step c1), performed before step d), of forming a protective layer, made of an amorphous material, overlaying the flank of the cavity and leaving the bottom of said cavity exposed to the external environment.

20 Claims, 6 Drawing Sheets

METHOD FOR MANUFACTURING A MIXED SUBSTRATE

TECHNICAL FIELD

The present invention relates to the field of microelectronics, and especially that of substrates for microelectronics.

The present invention particularly relates to a method for manufacturing a mixed or hybrid substrate for co-integrating regions or stacks having different natures.

The present invention relates, according to one particular embodiment, to a method for manufacturing a mixed substrate provided with so-called SaI (Silicon on Insulator) regions lying on an SOI Trap Rich layer and with regions made of a one-piece or bulk material.

The present invention especially relates to a method for manufacturing a mixed substrate for co-integrating logic, analogue, and radio frequency structures.

STATE OF PRIOR ART

The interest for mixed or hybrid substrates no longer needs to be proven.

Indeed, the latter generally provided with so-called bulk zones, and with SOI type zones make it possible to make components having different natures on one and a single substrate.

In this respect, a method for forming a mixed (or hybrid) substrate known from the state of the art is illustrated in FIGS. 1A-1E.

This method especially comprises the following steps consisting in:

i) providing an SOI substrate 1 which comprises a stack comprising from its front face 1A to its back face 1*b* a useful layer 2, made of silicon, a dielectric layer 3, made of silicon dioxide, and a support substrate 4 made of single crystal silicon;

ii) forming a mask 5 provided with apertures 5*a* exposing first regions of the stack, and for protecting second regions of the stack using parts 5*b*;

iii) forming cavities 8 by fully etching the useful layer 2 and the dielectric layer 3 at the apertures 5*a*; and iv) filling the cavities 8 with single crystal silicon 7 by epitaxial growth.

Forming the mask when performing step ii) may involve forming a layer 6*a* of dielectric material overlaying the front face, and defining apertures 5*a* by means of a resin mask 6*b* made according to one photolithographic method.

At the end of step iv), the first regions of the mixed substrate are made of bulk silicon, whereas the second regions comprise an SOI stack.

Step iv) can also be followed by a step v) of forming Shallow Trench Isolations (STI) 9, for isolating the first regions from the second regions.

This method known from the art and performed on an SOI substrate restricted to one useful layer and one dielectric layer is relatively satisfactory.

However, since contemplated applications involve forming radiofrequency components, a trap rich layer is interposed between the dielectric layer and support substrate.

This trap rich layer especially comprises polycrystalline silicon likely to disturb the execution of step iv). Particularly, the trap rich layer exposed at the walls of the cavities disturbs the execution of step iv), and consequently results in an erratic growth and in creating defects.

One purpose of the present invention is therefore to provide a method for manufacturing a mixed substrate for limiting the number of defects when performing the epitaxial growth step.

Another purpose of the present invention is to provide a method for manufacturing a mixed substrate provided with first bulk regions and with second regions comprising an SOI type stack lying on a trap rich layer.

DISCLOSURE OF THE INVENTION

The present invention therefore provides a method for manufacturing a mixed substrate from a starting substrate.

The starting substrate comprises, from a front face to a back face, an intermediate layer lying on a support substrate, especially a substrate of single crystal silicon.

The intermediate layer, according to the terms of the present invention, comprises a material likely to be used as a seed for epitaxially growing a first material.

By "be used as a seed", it is meant a layer at which seeds for growing said first material can be observed during an epitaxial growth step. By way of example, the intermediate layer can comprise a polycrystalline material, and more particularly polycrystalline silicon.

The invention therefore comprises the formation of a cavity in the starting substrate from the front face and which extends into the support substrate. The walls of the cavity are then lined with a protective layer, made of an amorphous material so as to mask sections of the intermediate layer which are uncovered at said walls.

Finally, the first material is epitaxially deposited from the bottom of the cavity in order to form a first region.

The support substrate is, in this respect, configured to promote single crystal growth of the first material.

Implementing the protective layer makes it possible to better control the growth of the first material, and particularly to limit creation of defects by seeding the first material at the walls of the cavity.

The purposes of the present invention are therefore, at least partly, achieved by a method for manufacturing a mixed substrate which comprises, on a main face of a support substrate, a first region, comprising a first single crystal material, and a second region, contiguous to the first region, and comprising a second material, the method comprising the following steps of:

a) providing a starting substrate which comprises a stack, formed by at least one intermediate layer, and overlaying the main face of the support substrate, the intermediate layer comprising the second material in a single crystal or polycrystalline form;

b) forming a mask on the stack, said mask comprising an aperture delimiting the location of the first region;

c) etching the stack at the aperture so as to form a cavity delimited by a bottom and walls, the bottom being located on or in the support substrate; and d) forming the at least one first region by epitaxially growing the first material in a single crystal form in the at least one cavity, the method being characterised in that it comprises a step c1), performed before step d), of forming a protective layer, made of an amorphous material, overlaying the walls of the at least one cavity and leaves the bottom of said cavity exposed to external environment.

According to one advantageous embodiment, step d) also comprises etching the first material likely to be formed in a polycrystalline form on the walls of the at least one cavity.

According to one advantageous embodiment, step c1) comprises forming a layer of material overlaying the stack, bottom and walls of the cavities, step c1) further comprising removing said layer of material at the bottom of the cavities.

Removing the layer of material can comprise anisotropic dry etching.

According to one implementation, the protective layer comprises at least one of the materials selected from: silicon dioxide, silicon nitride, SiCO, and SiBCN According to one implementation, step d) comprises at least one sequence comprising the steps of d1) epitaxially growing a layer made of the first material overlaying the bottom and walls of the at least one cavity; and d2) selectively etching the layer made of the first material deposited on the walls of the at least one cavity, The sequence is then repeated as many times as necessary for the at least one cavity to be filled with the first single crystal material.

This at least one sequence is advantageously implemented when the at least one cavity has an aspect ratio greater than one quarter.

According to another implementation, step d) comprises an epitaxial growth step for growing the first material in a single crystal way from the bottom of the cavity, and in a polycrystalline way on the protective layer, the growth step being performed in the presence of a chemical agent for selectively etching the first material in a polycrystalline form in view of its single crystal form.

For example, step d) implements a precursor comprising $SiH_4$ or dichlorosilane (DCS), and a chemical agent comprising HCl.

This implementation advantageously makes it possible to consider cavities having a small aspect ratio and especially lower than one quarter.

According to one implementation, the at least one first region and at least one second region each have a surface exposed to external environment flush with each other.

Advantageously, the stack can further comprise a useful layer and a dielectric layer disposed between said useful layer and the intermediate layer, the useful layer and dielectric layer being also etched at the at least one aperture when performing step c).

For example, the useful layer can comprise silicon, the dielectric layer can comprise silicon dioxide, and the intermediate layer can comprise polycrystalline silicon.

According to one implementation, step b) comprises forming a hard mask, the hard mask especially comprises a dielectric material.

According to one implementation, step c) comprises dry etching, especially plasma etching.

According to one implementation, the method further comprises a step e), performed after step d), of forming a trench isolation filled with a dielectric material for electrically insulating the at least one first region from the at least one second region.

According to one implementation, the trench isolation extends into the support substrate or stops in the intermediate layer.

BRIEF DESCRIPTION OF THE DRAWINGS

Further characteristics and advantages will appear in the following description of a method for manufacturing a mixed substrate, given by way of non-limiting examples, with reference to the appended drawings in which.

DETAILED DISCLOSURE OF PARTICULAR EMBODIMENTS

The present invention relates to a method for manufacturing a mixed (or hybrid) substrate from a starting substrate.

Figure 1A:
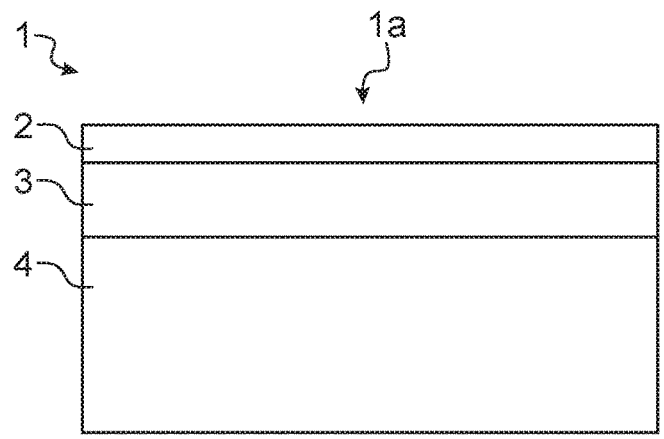
FIGS. 1A, 1B, 1C, 1D, and 1E are schematic representations of the different steps implemented for making a mixed substrate known from the state of the art, these figures are especially views along a section plane perpendicular to the front face of the SDI substrate.
Figure 1B:
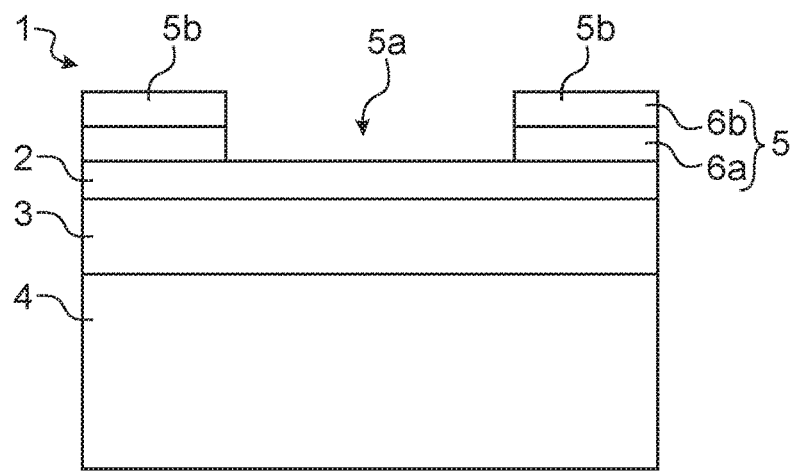
Figure 1C:
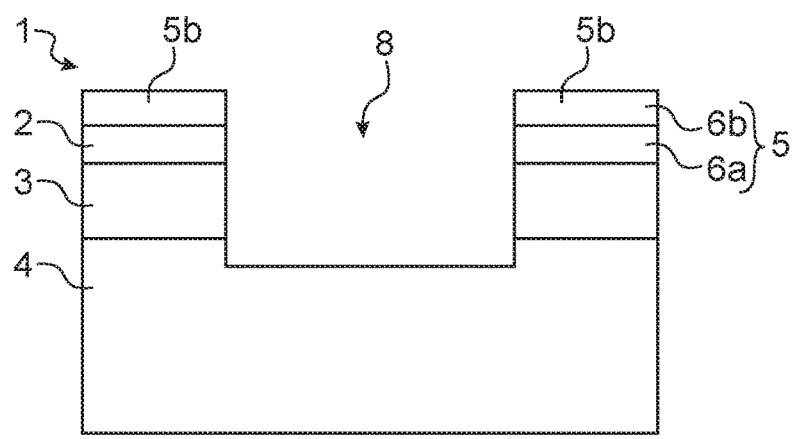
Figure 1D:
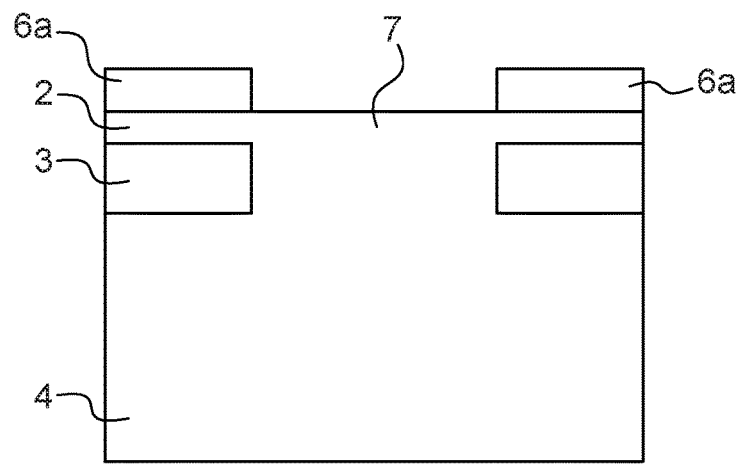
Figure 1E:
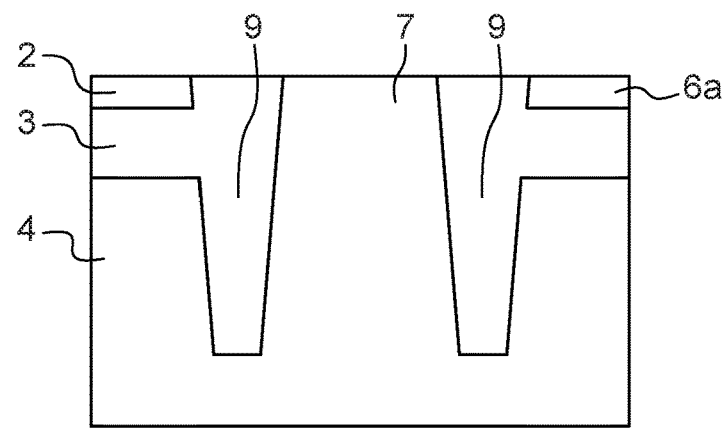
Figure 2:
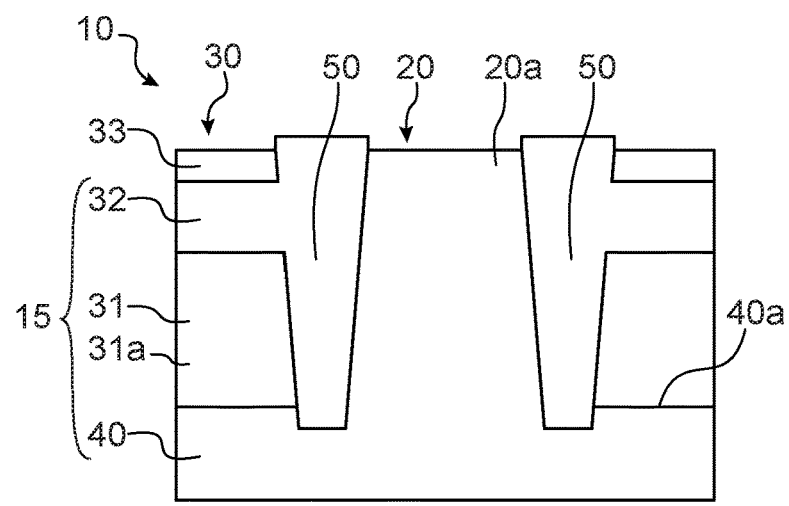
FIG. 2 is a schematic representation of a mixed substrate likely to be obtained by the manufacturing method according to the present invention, this figure is represented along a section plane perpendicular to a main face of the support substrate.

As represented in FIG. 2, the mixed substrate 10 comprises one or more first regions 20, one or more second regions 30, and a support substrate 40. Especially, the one or more first regions 20 as well as the one or more second regions 30 lie on a main face 40a of the support substrate 40.

The first region 20 comprises a first single crystal material 20a and the crystallographic orientation of which is dictated by the crystallographic orientation of the support substrate 40. It will clearly appear in the following of the description that the support substrate 40, since it dictates the crystal orientation of the first material 20a, is also in a single crystal form. The first material can comprise Si or SiGe.

The second region 30 comprises at least one intermediate layer 31 made of a second material 31a.

The intermediate layer 31 is intended to ensure a trapping function, and more particularly a function of trapping charges for example resulting from electrical resistivity of the second material 31a.

This charge trapping effect enables crosstalk between adjacent microelectronic devices to be limited.

The second material 31a can, in this respect, comprise a polycrystalline material, and more particularly polycrystalline silicon.

According to one particularly advantageous embodiment, the second region 30 can also comprise a dielectric layer 32 and a useful layer 33, lying on the second material and in this order.

By "useful layer", it is meant a layer on or in which one or more devices, for example microelectronic devices, is or are to be formed. The useful layer can especially comprise a region for forming a transistor channel.

The mixed substrate also comprises spacers 50 electrically insulating the first regions 20 from the second regions 30.

The method for manufacturing the mixed substrate is described, in the following of the presentation, in connection with FIGS. 3A to 3E.

The method comprises a step a) consisting in providing a starting substrate 60.

Figure 3A:
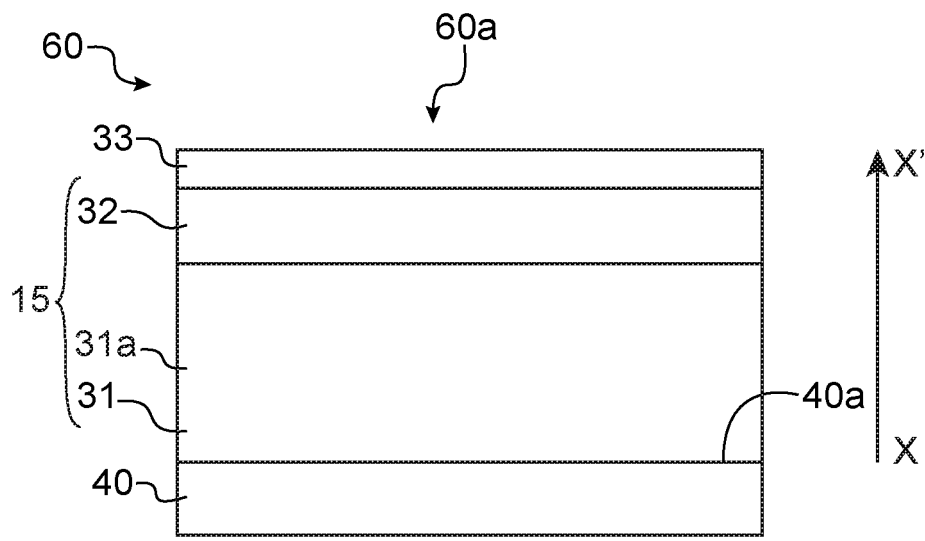
FIGS. 3A, 3B, 3C, 3D, and 3E are schematic representations of the different steps implemented for making a known mixed substrate according to the present invention, these figures are especially views along a section plane perpendicular to a main face of the support substrate.

The starting substrate 60 is formed by a stack 15 of layers, especially comprising an intermediate layer 31 which lies on the main face 40a of the support substrate 40 (FIG. 3A).

"A stack", according to the terms of the present invention comprises a layer or a stack of layers. A stack direction is then defined along an axis orthogonal to the main face 40a of the support substrate 40 and passing through it. A stack sense is also defined along the stack direction XX' extending from the main face 40a of the support 40 to the last stacked layer.

According to one advantageous embodiment, the stack 15 can comprise, along the stack sense the intermediate layer 31, a dielectric layer 32, and a useful layer 33.

The detailed description of the method for manufacturing a mixed substrate according to the present invention is limited to implementing a starting substrate 60 provided with the support substrate 40 and on a main face 40a of which, the intermediate layer 31, the dielectric layer 32 and the useful layer 33 lie in this order (in other words, along the stack sense XX').

Those skilled in the art with their general knowledge and the following description, will be able to easily adapt the invention to a starting substrate free of either or both of the dielectric layer 32 and useful layer 33.

According to one particularly advantageous embodiment, the starting substrate 60 is a substrate of silicon on insulator integrating a so-called 501 trap Rich intermediate layer.

By way of example, the intermediate layer 31 is made of the second material 31a of polycrystalline silicon ("polysilicon") with a thickness between 10 nm and 2000 nm, the dielectric layer 32 can comprise silicon dioxide and have a thickness between 10 nm and 145 nm (for example equal to 25 nm), and the useful layer 33 can comprise silicon and have a thickness between 3 nm and 30 nm (for example equal to 6 nm).

Figure 3B:
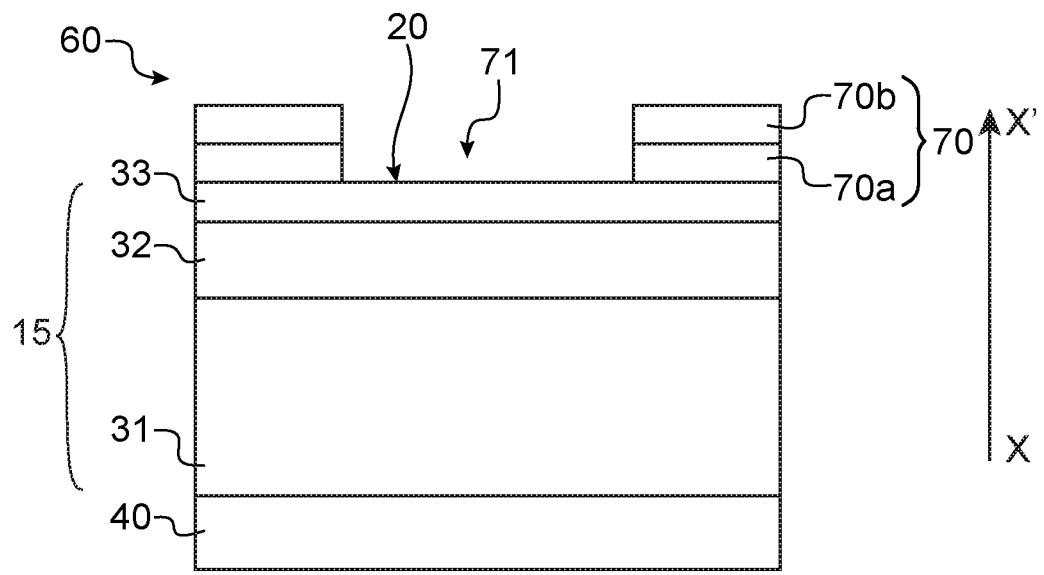

The method according to the present invention comprises a step b) of forming a mask 70 on the last layer of the stack 15 (FIG. 3B).

The mask 70 especially comprises one or more apertures 71 delimiting the location of the first region 20.

The mask 70 can comprise a hard mask.

Forming the hard mask can involve the following sequence:
- depositing one or more masking layers 70a, for example a layer of silicon nitride and/or silicon dioxide;
- depositing a layer 70b of photolithographic resin overlaying the one or more masking layers 70a;
- a photolithography step for printing the pattern relating to the aperture 71; and
- a step of etching the one or more masking layers 70a through the pattern in order to form the aperture 71.

Figure 3C:
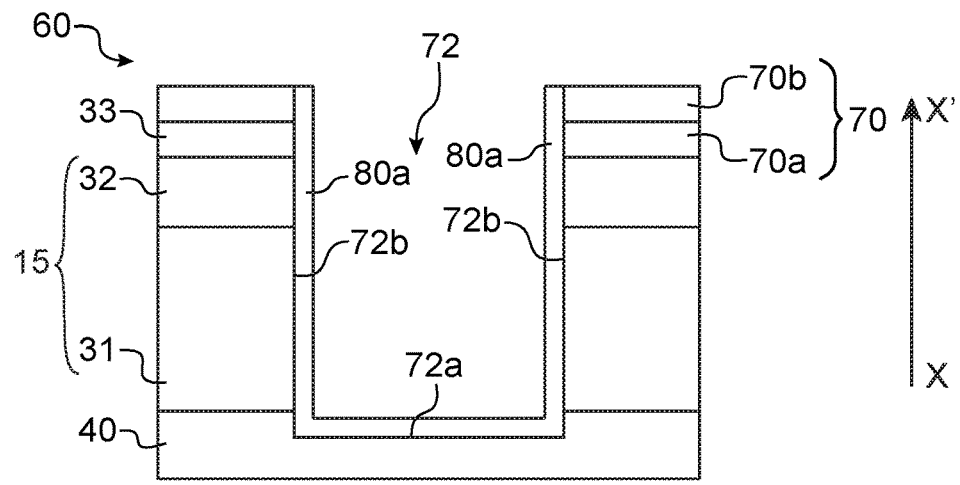

Step b) is followed by a step c) which consists in etching the useful layer 33, dielectric layer 32 and intermediate layer 31 at the aperture 71 so as to form a cavity 72 in the starting substrate 60 (FIG. 3C).

The cavity 72 is delimited by a bottom 72a surmounted by walls 72b which extend from the useful layer 33 to at least the interface 40b between the intermediate layer 31 and support substrate 40. In other words, the support substrate 40 has an exposed cross-section forming the bottom 72a of the cavity 72.

According to one first alternative, the etching step c) can be stopped at the interface 40b formed between the intermediate layer 31 and support substrate 40, or according to one second alternative it can be stopped in the bulk of the support substrate 40. It is understood that implementing the second alternative enables an intact part of the support substrate 40 to be kept so as to form the bottom 72a of the cavity 72.

The etching step c) can comprise dry etching, and especially plasma etching. For example, the dry etching step can be performed by means of a fluorocarbon plasma in a reactive ion etching equipment.

Figure 3D:
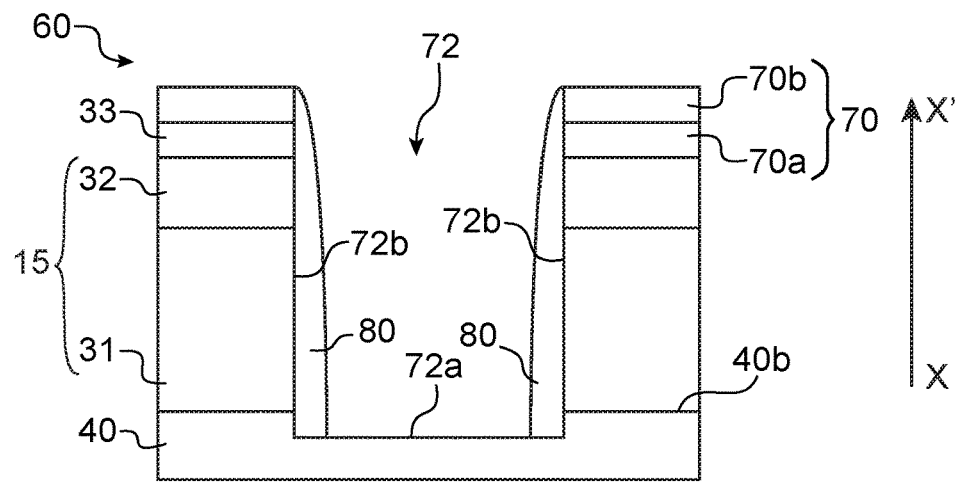

The method according to the present invention also comprises a step c1) of forming a protective layer 80. According to one example of embodiment, the protective layer 80 is made of an amorphous material. As illustrated in FIG. 3D, at the end of step c1), the protective layer 80 is located on the walls 72b delimiting the cavity 72 (FIG. 3D).

More particularly, the protective layer 80 is formed overlaying the walls 72b and leaves the bottom 72a of the cavity 72 exposed to external environment. More particularly, and advantageously, the protective layer 80, at the end of step c1), exclusively, and advantageously totally, overlays the walls 72b of the cavity, and leaves the bottom 72a exposed to the external environment.

Step c1) can especially comprise forming a material, especially layer 80a of dielectric material, overlaying the bottom 72a and walls 72b of the cavity 72, followed by removing said layer 80a of material at the bottom of the cavity 72 (FIGS. 3C and 3D).

According to one alternative, forming the layer 80a of material can comprise a step of depositing an electrically insulating material, such as a dielectric For example, depositing can be performed by an atomic layer deposition technique which enables conformal deposition. In this respect the layer 80a of material can comprise one of the materials selected from: Si3N4, SiO2, and SiCO.

Figure 4A:
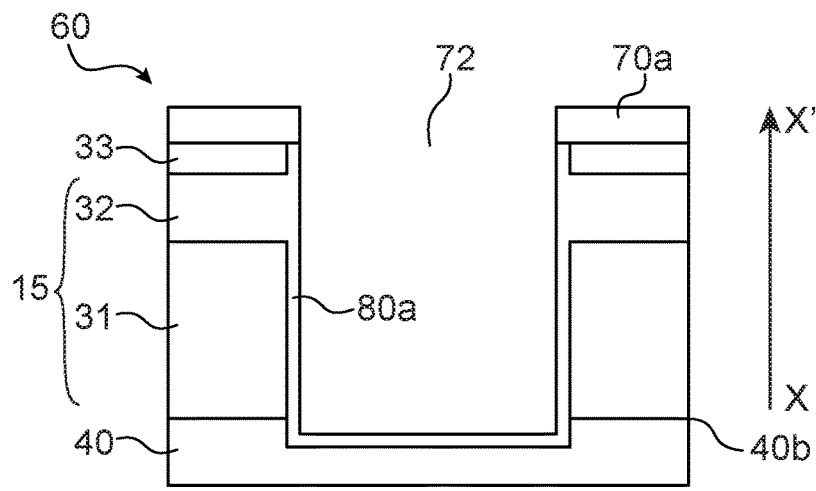
FIGS. 4A, 4B, and 4C are schematic representations illustrating forming the protective layer by thermal oxidation.
Figure 4B:
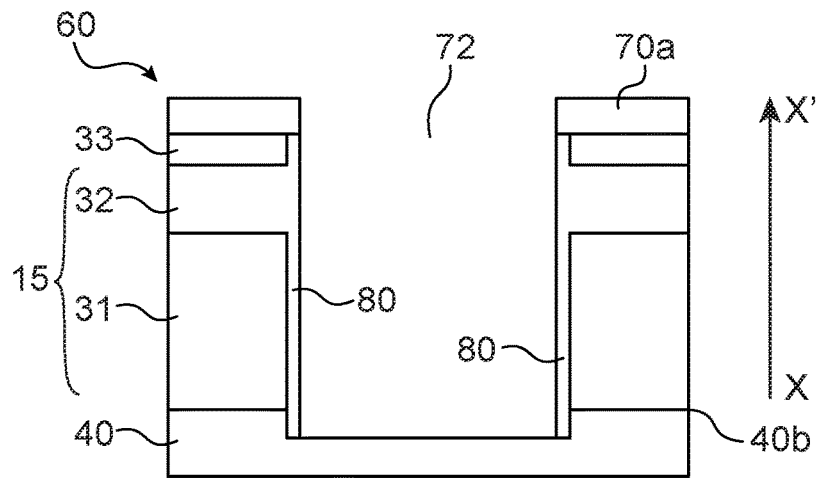

The thickness of the protective layer 80, subsequent to deposition can be between 5 nm and 15 nm, FIGS. 4A and 4B are schematic representations of another alternative implementation of step c1). More particularly, FIG. 4A schematically illustrates forming the layer 80a of material, whereas FIG. 4B relates to a removing step hereafter discussed. According to this other alternative, forming the layer 80a of material can be made by thermal oxidation (FIG. 4A). As the starting substrate 60 comprises an intermediate layer made of silicon, and more particularly polycrystalline silicon, the layer 80a of material comprises silicon dioxide.

Whatever the alternative considered for forming the protective layer 80, removing the layer 80a of material at the bottom of the cavity 72 can be performed, as illustrated in FIGS. 3D and 4B, by an anisotropic etching step. Anisotropic etching is known to those skilled in the art and is similar to that implemented for forming spacers on side faces of a transistor gate.

Figure 3E:
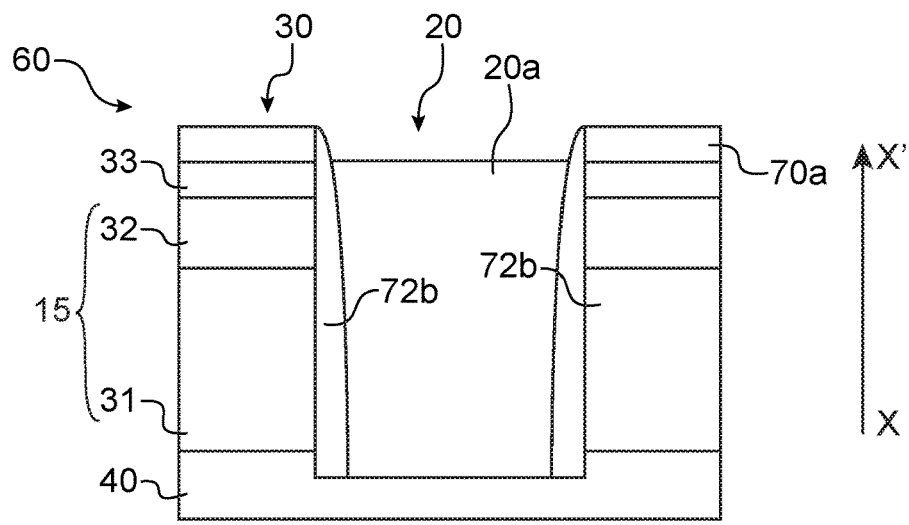

Step c1) of forming the protective layer 80 is followed by a step d) of forming the first region 20 by epitaxially and selectively growing the first material 20a in a single crystal form in the cavity 72 (FIG. 3E). Step d) can especially be performed for the first material 20a to entirely fill the cavity 72.

It is understood that, insofar as the walls 72b of the cavity 72 are covered with the protective layer 80, the growth, and especially crystal orientation, of the first material 20a is determined by the nature and crystal orientation of the support substrate 40 at the bottom 72a.

The protective layer 80 (in an amorphous material form) limits occurrence of crystal defects during the step of epitaxially growing the first material.

Figure 4C:
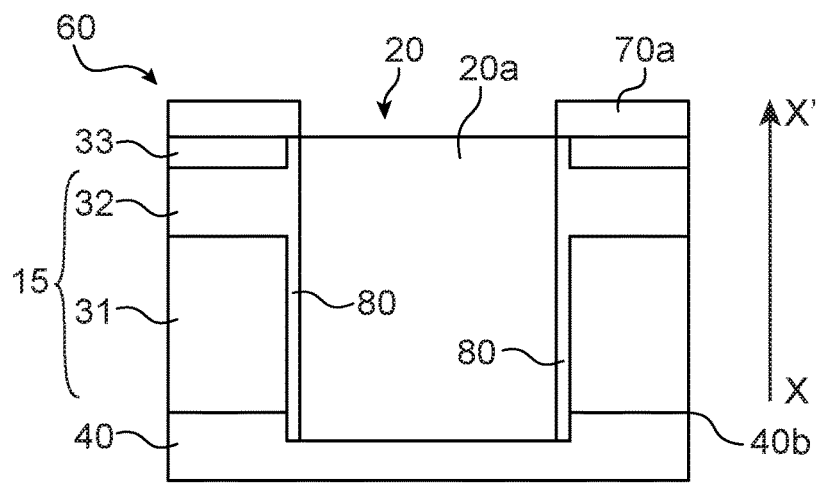

According to one first alternative, the selective growth step can comprise a sequence comprising the steps consisting in:

d1) epitaxially growing a layer made of the first material 20a overlaying the bottom 72a and walls 72b of the cavity 72; and d2) selectively etching the layer made of the first material 20a deposited on the walls 72b of the cavity 72 (FIGS. 3E and 4C).

The sequence comprising steps d1) and d2) can then be repeated as many times as necessary for the cavity 72 to be filled with the first single crystal material 20a.

According to this first alternative, the aspect ratio of the cavity 72 is advantageously greater than one quarter.

By "aspect ratio", it is meant the ratio of a characteristic dimension of the aperture of the cavity to the depth thereof. The width, according to the present invention, is measured from one wall of the cavity to the other along an axis orthogonal to the stack direction. Particularly, this characteristic dimension can be the side of a square, the length of a rectangle or even the diameter of a circle. However the invention is not limited to these shapes only, and those skilled in the art, in consideration of the given definition thereof, will be able to determine the dimension characteristic of other shapes.

According to one second alternative, the growth step d) comprises an epitaxial growth step for growing the first material 20a in a single crystal way from the bottom 72a of the cavity 72, and in a polycrystalline or defective way from the protective layer 80.

The growth step is additionally performed in the presence of a chemical agent for selectively etching the first material in a polycrystalline form in view of its single crystal form.

By way of example, forming a first region 20 made of single crystal silicon can entail a silane ($SiH_4$) or dichlorosilane ($SiH_2Cl_2$) type precursor in the presence of a chemical agent which comprises hydrogen chloride (HCl).

This second alternative enables aspect ratios for the cavity 72 lower than one quarter to be considered.

Whatever the alternative considered, the first region 20 and second region 30 each have a surface exposed to external environment flush with each other. The method according to the present invention can also comprise a step e) of forming a trench isolation 90 filled with a dielectric material 91 for electrically isolating the at least one first region 20 from the at least one second region 30.

Step e) particularly comprises forming a trench 90 around or along the first region 20.

Figure 5A:
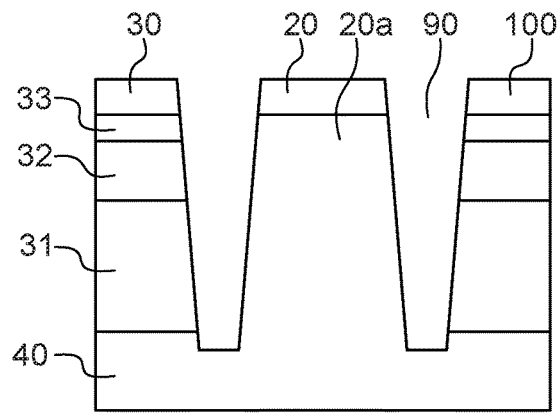
FIGS. 5A and 5B schematically illustrate forming trench isolations according to the first alternative of the present invention.
Figure 6A:
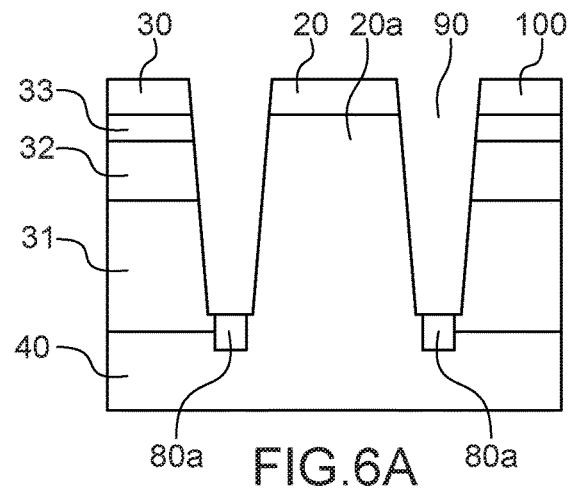
FIGS. 6A and 6B schematically illustrate forming trench isolations according to the second alternative of the present invention.

Especially, FIGS. 5A and 6A illustrate forming the trench 90 according to the first alternative and second alternative, respectively.

Forming the trench 90 can comprise the following steps of:

e1) forming a hard mask 100 of silicon dioxide and/or silicon nitride; and e2) dry and anisotropic etching.

The second alternative (FIG. 6A) reveals a remaining amount 80a of the protective layer 80 at the end of step e).

The trench 90 is subsequently filled with a dielectric material 91, for example silicon dioxide.

Figure 5B:
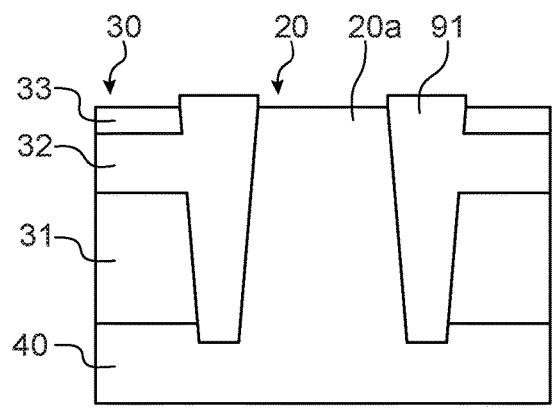
Figure 6B:
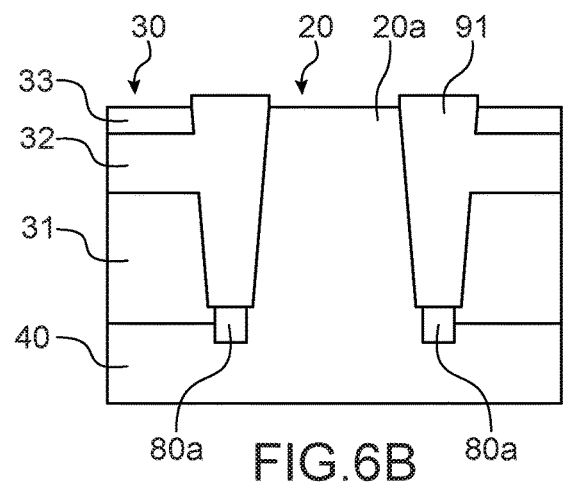

In this respect, FIGS. 5B and 6B illustrate filling the trench 90 according to the first alternative and the second alternative, respectively.

Filling can particularly comprise conformally depositing said dielectric material 91 followed by a chemical mechanical polishing step so as to keep the dielectric material only in the trench.

The hard mask can also be removed according to one selective etching step.

Figure 7:
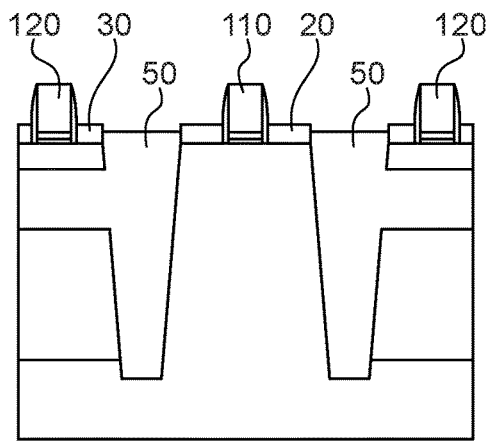
FIG. 7 is a schematic representation of a mixed substrate obtained by the manufacturing method according to the present invention and on which microelectronic devices are formed.

Finally, the method according to the present invention can also comprise a step of forming microelectronic devices 110 and 120, on the first and second regions, respectively (FIG. 7).

The mixed substrate obtained at the end of step d) is free of microelectronic component, and especially of transistor.

The invention claimed is:

1. A method for manufacturing a mixed substrate which comprises, on a main face of a support substrate, a first region comprising a first single crystal material and a second region, contiguous to the first region and comprising a second material, the method comprising the steps of:

a) providing a starting substrate which comprises a stack comprising at least one intermediate layer overlaying the main face of the support substrate, the intermediate layer comprising the second material in a single crystal or polycrystalline form;

b) forming a mask on the stack, said mask comprising an aperture delimiting location of the first region;

c) etching the stack at the aperture so as to form a cavity delimited by a bottom and walls, the bottom being located on or in the support substrate; and d) forming the first region by epitaxially growing the first single crystal material in a single crystal form in the cavity, wherein the method comprises a step c1), performed before step d), of forming a protective layer, made of an amorphous material, exclusively covering the walls of the cavity and leaving the bottom of said cavity exposed to an external environment.

2. The method according to claim 1, wherein, at an end of step d), the first single crystal material entirely fills the cavity.

3. The method according to claim 1, wherein step c1) comprises forming a layer of material overlaying the bottom and walls of the cavity, and removing said layer of material at the bottom of the cavity.

4. The method according to claim 1, wherein the protective layer comprises at least one of materials selected from: silicon dioxide, silicon nitride, SiCO, and SiBCN.

5. The method according to claim 1, wherein step d) comprises at least one sequence comprising the steps of:

d1) epitaxially growing a layer made of the first single crystal material overlaying the bottom and walls of the cavity; and d2) selectively etching the layer made of the first single crystal material deposited on the walls of the cavity, the sequence being repeated as many times as necessary for the cavity to be filled with the first single crystal material.

6. The method according to claim 1, wherein step d) comprises an epitaxial growth step for growing the first single crystal material in a single crystal manner from the bottom of the cavity, and growing a third material in a polycrystalline manner on the protective layer, the epitaxial growth step being performed in a presence of a chemical agent for selectively etching the third material in a polycrystalline form in view of the first single crystal material.

7. The method according to claim 6, wherein step d) includes a precursor comprising $SiH_4$ or dichlorosilane, and a chemical agent comprising HCl.

8. The method according to claim 6, wherein the cavity has an aspect ratio lower than one quarter.

9. The method according to claim 1, wherein the first region and second region each have a surface exposed to an external environment flush with each other.

10. The method according to claim 1, wherein the stack further comprises a useful layer and a dielectric layer, the dielectric layer being disposed between said useful layer and the intermediate layer, the useful layer and dielectric layer being also etched at the aperture when performing step c).

11. The method according to claim 1, wherein step b) comprises forming a hard mask, the hard mask comprising a dielectric material.

12. The method according to claim 1, wherein step c) comprises dry etching.

13. The method according to claim 1, wherein the method further comprises a step e), performed after step d), of forming a trench isolation filled with a dielectric material for electrically insulating the first region from the second region.

14. The method according to claim 1, wherein the first single crystal material comprises at least one of materials selected from: Si and SiGe.

15. The method according to claim 1, wherein the mixed substrate obtained at the end of step d) is free of microelectronic component.

16. The method according to claim 1, wherein step d) further comprises etching a third material formed in a polycrystalline form on the walls delimiting the cavity.

17. The method according to claim 3, wherein step c1) comprises removing the layer by anisotropic dry etching.

18. The method according to claim 5, wherein the cavity has an aspect ratio greater than one quarter.

19. The method according to claim 10, wherein the useful layer comprises silicon, the dielectric layer comprises silicon dioxide, and the intermediate layer comprises polycrystalline silicon.

20. The method according to claim 13, wherein step e) comprises forming the trench isolation to extend into the support substrate or stop in the intermediate layer.

* * * * *